United States Patent
Luo

(10) Patent No.: US 6,256,766 B1
(45) Date of Patent: Jul. 3, 2001

(54) METHOD AND APPARATUS FOR REDUCING CLOCK SKEW

(75) Inventor: Wenzhe Luo, Allentown, PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/184,742

(22) Filed: Nov. 3, 1998

(51) Int. Cl.$^7$ .......................... G06F 17/50; H03K 17/693
(52) U.S. Cl. .................................. 716/6; 716/15
(58) Field of Search .................. 716/1, 2, 4, 5, 716/6, 7, 8, 12, 13, 14, 15

(56) References Cited

U.S. PATENT DOCUMENTS

| | | | |
|---|---|---|---|
| 5,410,491 | * | 4/1995 | Minami .................................. 716/6 |
| 5,557,779 | * | 9/1996 | Minami .................................. 716/6 |
| 5,638,291 | * | 6/1997 | Li et al. ................................. 716/18 |
| 5,798,935 | * | 8/1998 | Doreswamy et al. .................... 716/6 |
| 5,799,170 | * | 8/1998 | Drumm et al. ........................... 716/2 |
| 5,912,820 | * | 6/1999 | Kerzman et al. ....................... 716/14 |
| 5,926,397 | * | 7/1999 | Yamanouchi et al. ................. 716/14 |
| 5,963,728 | * | 10/1999 | Hataway et al. ......................... 716/3 |
| 6,006,025 | * | 12/1999 | Cook et al. ............................ 716/14 |
| 6,009,248 | * | 12/1999 | Sato et al. ................................ 716/2 |
| 6,044,209 | * | 3/2000 | Alpert et al. ............................. 716/6 |

* cited by examiner

Primary Examiner—Matthew Smith
Assistant Examiner—Leigh Marie Garbowski
(74) Attorney, Agent, or Firm—William H. Bollman

(57) ABSTRACT

A method for reducing skew in a common signal as applied to individual elements in the design phase. In accordance with the principles of the present invention, the design of the wiring is established and augmented with compensation elements and/or delay elements as necessary to equalize the skew as between all relevant components. In the disclosed embodiment, the method generally comprises three general steps: (1) grouping loads on the common signal; (2) creating a signal wiring tree and inserting delay cells; and (3) providing necessary loading compensation. The loads are grouped such that each utilized node on a central wiring experiences substantially equal loading, with compensating loads added as necessary. The nodes are established at intervals corresponding to the availability of delay elements, which are added to the branches feeding the farthest elements as necessary to equate the time delay of each node with respect to the source of the common signal.

21 Claims, 8 Drawing Sheets

STARTING CLOCK NETWORK AFTER PLACEMENT AND INITIAL ROUTING

US 6,256,766 B1

METHOD AND APPARATUS FOR REDUCING CLOCK SKEW

BACKGROUND OF THE INVENTION

1. Field of the Invention

This invention relates generally to a method for optimizing the layout of wiring in an Integrated Circuit (IC) or on a printed circuit board (PCB). More particularly, it relates to a method for minimizing skew relating to the simultaneous application of a common signal, e.g., a clock signal, as applied to separate elements on an IC or PCB.

2. Background of Related Art

Layout-related signal skew in an integrated circuit (IC) or on a printed circuit board (PCB) is a significant constraint to the increase of signal speeds. Signal skew relates to a time differential between when the voltage level of a common signal actually rises (or falls) to a given level at any component receiving that common signal. The greater the skew (or time differential), the longer the time delay which must be designed into the system to ensure that all the relevant components acting on the common signal have received the common signal properly.

FIG. 5 depicts in idealistic form a common signal (e.g., a clock signal) which is skewed in waveform (b) with respect to that shown in waveform (a). In actual practice, the resistance and capacitance in the wiring transmitting the signals create an 'RC' time constant which requires a certain amount of time to rise (or fall) to a given level (e.g., 90% of maximum). Although this tends to round the rising and falling edges of the signal, the signal is shown as a square wave in FIG. 5 for ease of description. The effects of an RC time constant on printed circuit board wiring are well known in the art.

The square wave signal (e.g., a clock signal) shown in waveforms (a) and (b) of FIG. 5 represent a same or common signal as applied to two separate components located a distance apart on a printed circuit board. The clock signal shown in waveform (b) is skewed by an amount S from that shown in waveform (a) due to a larger RC time constant exhibited by the wiring relating to the component receiving the signal shown in waveform (b). This larger RC time constant is the result of many factors, e.g., longer wiring path to the second component from the clock source than to the first component, larger loading by the second component than by the first component, etc. Signal skewing, and in particular clock skewing, inhibits chip designs from gaining higher speeds.

Computer Aided Design (CAD) systems are often utilized to design features such as the wiring for integrated circuits and printed circuit boards. FIG. 6 shows a conventional CAD system 800 including a placement and routing module 802 for designing the wire routing for a given circuit on an IC or PCB.

The conventional placement and routing module 802 may perform any of several different techniques to reduce signal skew in the wire routing design: (1) Formation of an 'H'-Tree for identical units; (2) Trunk and branch formation; and (3) Use of delay-locked loops.

(1) Formation of an 'H'-Tree for Identical Units

The formation of an H-Tree wiring path relates to the formation of a distance-balanced tree from a common signal source to each of a plurality of identical units.

FIG. 7 shows the implementation of the conventional formation of an 'H'-Tree technique to reduce signal skew. In particular, a signal source (e.g., a clock signal source) 100 provides a common signal along a central wiring 420. From the central wiring 420, equal outriggers 422–432 provide the common signal to respective elements 401–406. Ideally, the placement of the elements 401–406 is symmetrical with respect to the central wiring 420.

This technique is used most commonly with array processors and/or memory arrays, but is limited as to its application for general use because of its dependency on identically (or approximately identically) loading elements. Thus, this technique is not very popular in general use, e.g., because many IC and/or PCB designs are not array processors.

(2) Trunk and Branch Formation

This method is perhaps the most popular technique, particularly in the design of clock signal distribution in an IC and/or PCB. Using this technique, a large wiring (i.e., the 'Trunk') is created, from which the separate elements utilizing the signal are serviced by separate wiring paths (i.e., 'Branches') from the Trunk.

Thus, for instance, the output of a large capacity signal buffer provides the common signal to the Trunk, which is typically formed from a wide metal path which extends across the entire IC (or PCB). The signal buffer (e.g., a clock signal buffer) is typically capable of driving all elements connected electrically to the Trunk.

FIG. 8 shows the implementation of the conventional formation of Trunks and Branches technique to reduce signal skew.

In particular, a clock source 100 provides a common signal to an enlarged central wiring or trunk 520. Short connections 522–530 provide the common signal to each of a plurality of elements 501–505 disbursed about the IC or PCB. Ideally, the trunk 520 is as large as possible to reduce the amount of resistance (e.g., sheet resistance) between the clock source 100 and any of the elements 501–505.

Accordingly, in this conventional technique, branches 522–530 are formed out from the trunk 520, e.g., perpendicular to the length of the trunk 520, to service the respective separate elements 501–505. In some cases, several layers of branches may be used (e.g., forming 'branches' and 'twigs') which are perpendicular to one another until the trunk 520 is brought into electrical connection with the intended element 501–505. Typically, each layer is formed perpendicular to the layer before, and is usually thinner than the layer before. This technique, though easily implemented, has the potential to cause rather than prevent significant signal skew between the closest node(s) (e.g., the connection between the trunk 520 and branch 522) and the farthest node(s) (e.g., the connection between the trunk 520 and branch 528).

(3) Use of Delay-Locked Loops

Using this technique, the insertion of delay-locked loops (DLLs) into blocked sections of the signal paths helps to synchronize the common signal as it is clocked into the separate sections.

FIG. 9 shows an implementation of the conventional use of delay-locked loops to reduce signal skew to functional blocks.

In particular, a clock source 100 provides a common signal to a central wiring 620, which carries the common signal to a limited number of DLLs 640–644 strategically located throughout the IC or PCB. Typically, the DLLs 640–644 are used to synchronize the application of a common signal to separate functional blocks, e.g., functional blocks 670–674. Each of the functional blocks 670–674 may comprise any number and variety of separate components, e.g., elements 601 and 602 in functional block 670, elements 603 and 604 in functional block 672, and elements 605–607 in functional block 674. The DLLs 640–644 use the clock source as a reference and generate a new clock for each block. The new clock will be synchronized with the original clock source, assuring the original clock source has small skews because it drives only the DLLs.

This technique is utilized most often in large scale design to reduce signal skew between separate functional blocks of a circuit. However, it has the potential to cause increased overhead. Moreover, because it is typically used only at the head-end of functional blocks, it does not prevent skewing of a common signal as between separate components within a functional block.

Unfortunately, this technique has its limits. For instance, if all elements were to implement a latched delay, the issue of skew would reassert itself with respect to the skew between the clock signals to each of the separate latches. Thus, there is a balance as between the number of latched delays to implement, and the benefit derived with respect to improved skew.

Although conventional techniques have tended to reduce skew in a common signal as applied to separate components, these techniques are either applicable to signals which are fed to identical types of components, require a large amount of area to implement, and/or relate only to functional blocks and not to separate components. There is still a need for a technique for reducing signal skew in an IC and/or PCB which is capable of reducing skew to each of the individual components, and/or which do not require a significant amount of surface area to implement.

SUMMARY OF THE INVENTION

A method of designing wiring routing to minimize skew of a common signal as applied to a plurality of elements in accordance with the principles of the present invention comprises grouping the plurality of elements to respective nodes of the wiring routing based on a load associated with each of the plurality of elements, each node of the wiring routing having a distance from a signal source associated therewith and having substantially no greater than an approximate integer multiple of a unit loading grouped thereon. A wire for the common signal is routed to each of the grouped plurality of elements. Any necessary grouped plurality of elements are compensated with a load sufficient to bring a total load associated with the grouped plurality of elements to a load substantially equal to an integer multiple of the unit loading.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a method for reducing skew in a common signal as applied to individual elements in the design phase. In accordance with the principles of the present invention, the design of the wiring is established and augmented with compensation elements and/or delay elements as necessary to equalize the skew as between all relevant components.

In the disclosed embodiment, the method comprises three general steps: (1) grouping loads on the common signal; (2) creating a signal wiring tree and inserting delay cells; and (3) providing necessary loading compensation. The loads are grouped such that each utilized node on a central wiring experiences substantially equal loading, with compensating loads added as necessary. The nodes are established at intervals corresponding to the availability of delay elements, which are added to the branches feeding the farthest elements as necessary to equate the total time delay (i.e., RC time delay relating to resistance and capacitance of wiring, plus any time delay introduced by delay elements) of each node with respect to the source of the common signal.

The method of the present invention can be performed in a hierarchical manner, and is especially applicable for use by automatic placement and routing tools common in Integrated Circuit (IC) and/or printed circuit board (PCB) design applications.

In accordance with the principles of the present invention, a sufficiently large signal source capable of driving the necessary loads is sufficient, without the need for subsequent buffering. Of course, the principles of the present invention may be combined with conventional techniques as desired for the particular application.

Preferably, to optimize the minimization of signal skew, the wiring between the signal source and each of the served elements is similar for each trace. Thus, within the same hierarchical level of signal distribution network on the IC or PCB, it is preferred that the metal wiring have the same width, thickness, material, etc. Moreover, it is preferred that vias (i.e., plated holes allowing an interconnection from layer to layer on a PCB) be avoided. Alternatively, if vias or other discontinuities are permitted, preferably the discontinuity is implemented similarly in the wiring path to each element to maintain a similar distributed RC time constant per unit length in a path between the signal source and each of the relevant elements.

Figure 1:
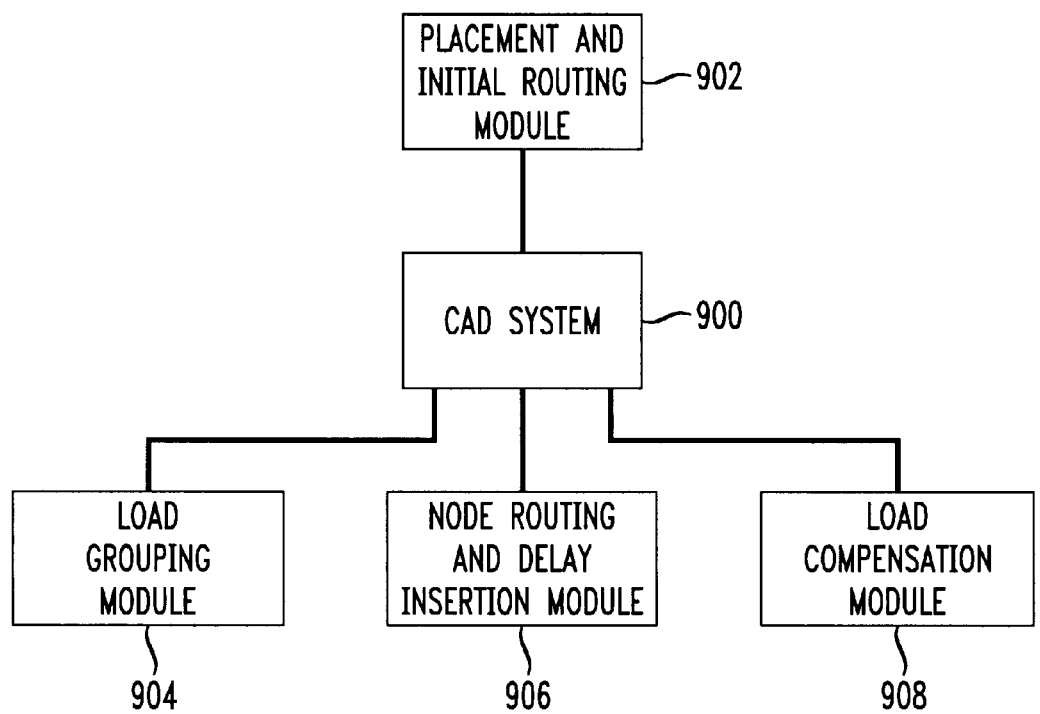
FIG. 1 shows a routing and placement system including a load grouping module, node routing and delay insertion module, and load compensation module in accordance with the principles of the present invention.
Figure 6:
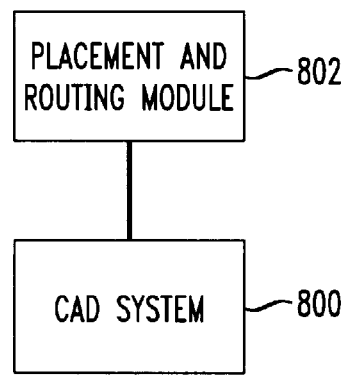
FIG. 6 shows a conventional CAD system including a placement and routing module for designing the wire routing for a given circuit on an IC or PCB.
Figure 7:
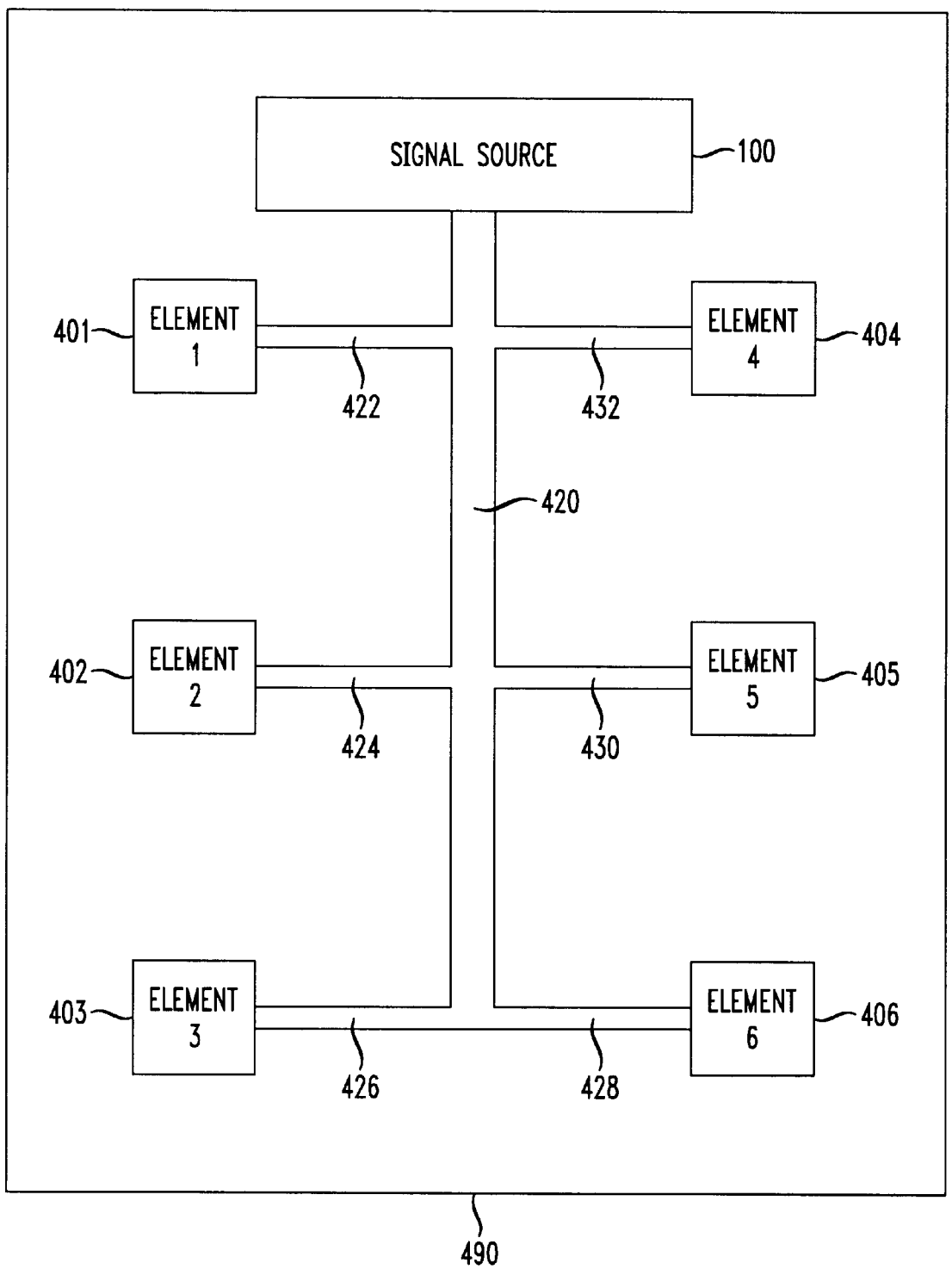
FIG. 7 shows the implementation of the conventional formation of an 'H'-Tree technique to reduce signal skew.
Figure 8:
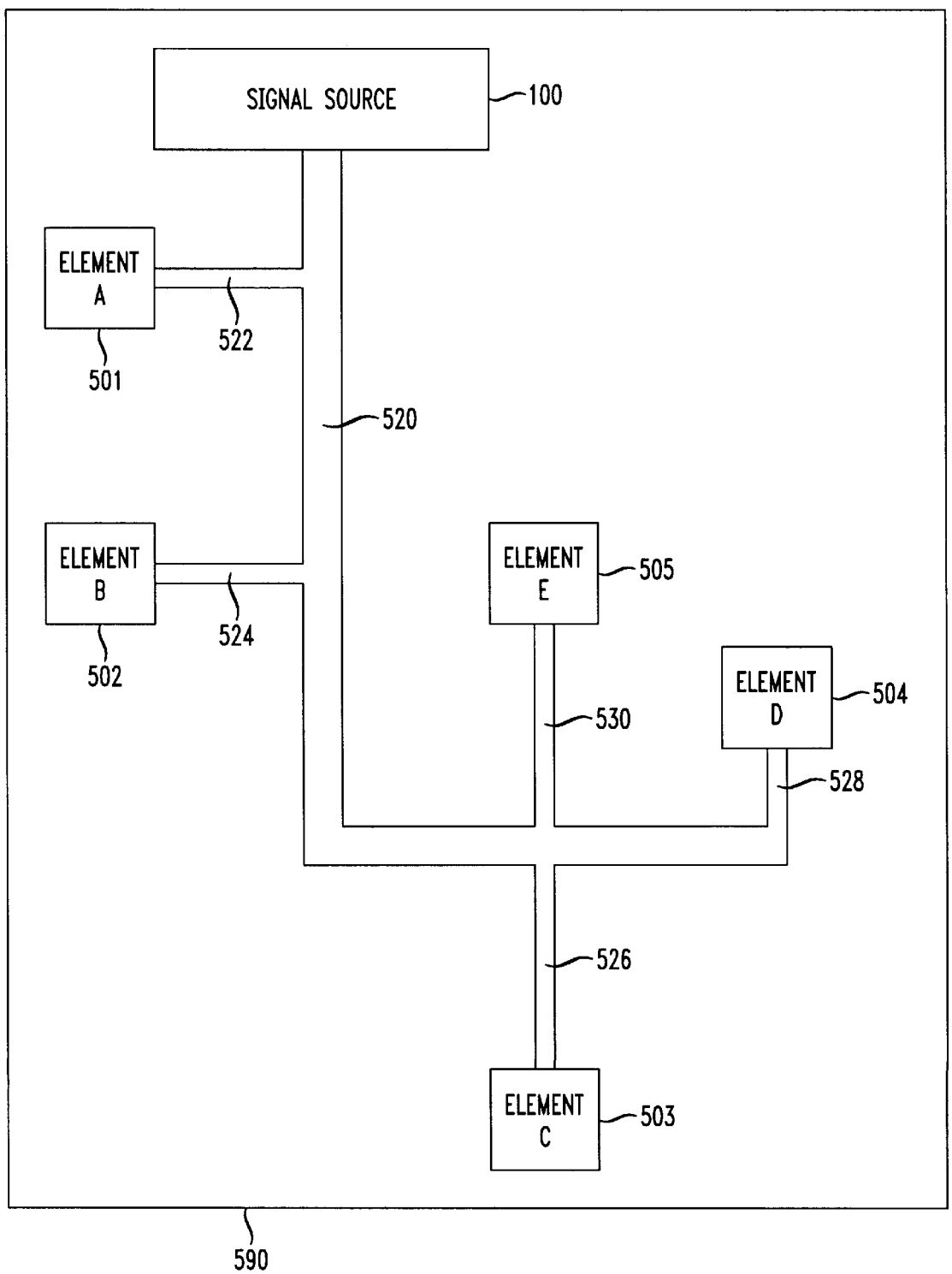
FIG. 8 shows the implementation of the conventional formation of Trunks and Branches technique to reduce signal skew.
Figure 9:
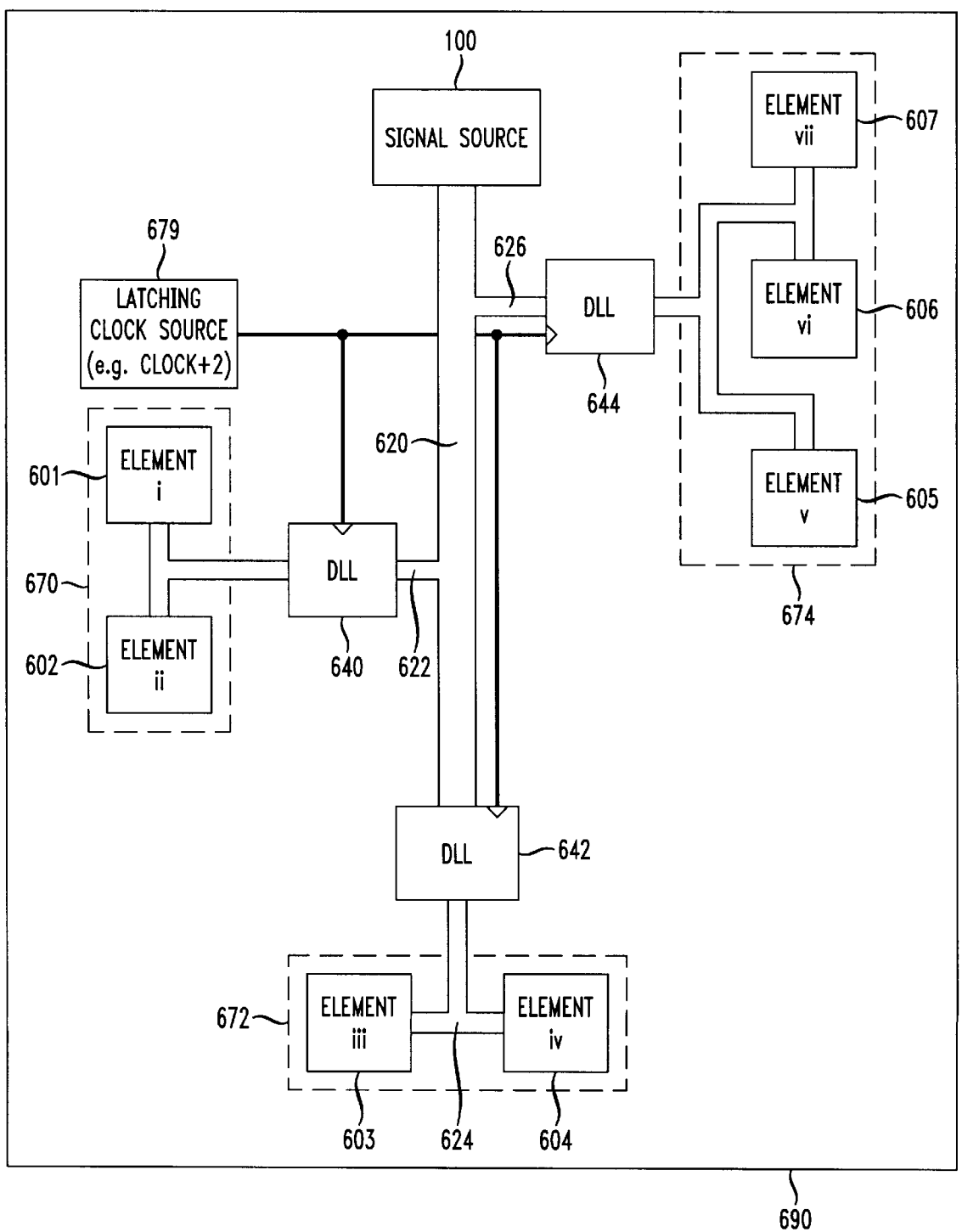
FIG. 9 shows the implementation of the conventional use of delay-locked loops to reduce signal skew to functional blocks.

FIG. 1 shows a CAD system including a placement and initial routing module 902 which otherwise operates as in a conventional system, e.g., as shown in FIG. 6. However, the CAD system further includes a load grouping module 904, a node routing and delay insertion module 906, and a load compensation module 908, in accordance with the principles of the present invention.

The load grouping module 904, the node routing and delay insertion module 906, and the load compensation module 908 are preferably software programs operating on the CAD system 900. However, it is within the principles of the present invention to operate any or all of the load grouping module 904, node routing and delay insertion module 906, and/or load compensation module 908 separately from the CAD system 900.

In the disclosed embodiment, the design method of the present invention is performed after each of the elements are placed on the IC or PCB, including the signal source. Moreover, in the disclosed embodiment, the design method is implemented subsequently to an initial routing of the relevant signal line, particularly since an initial routing will typically help define physical placement of the elements.

Figure 2:
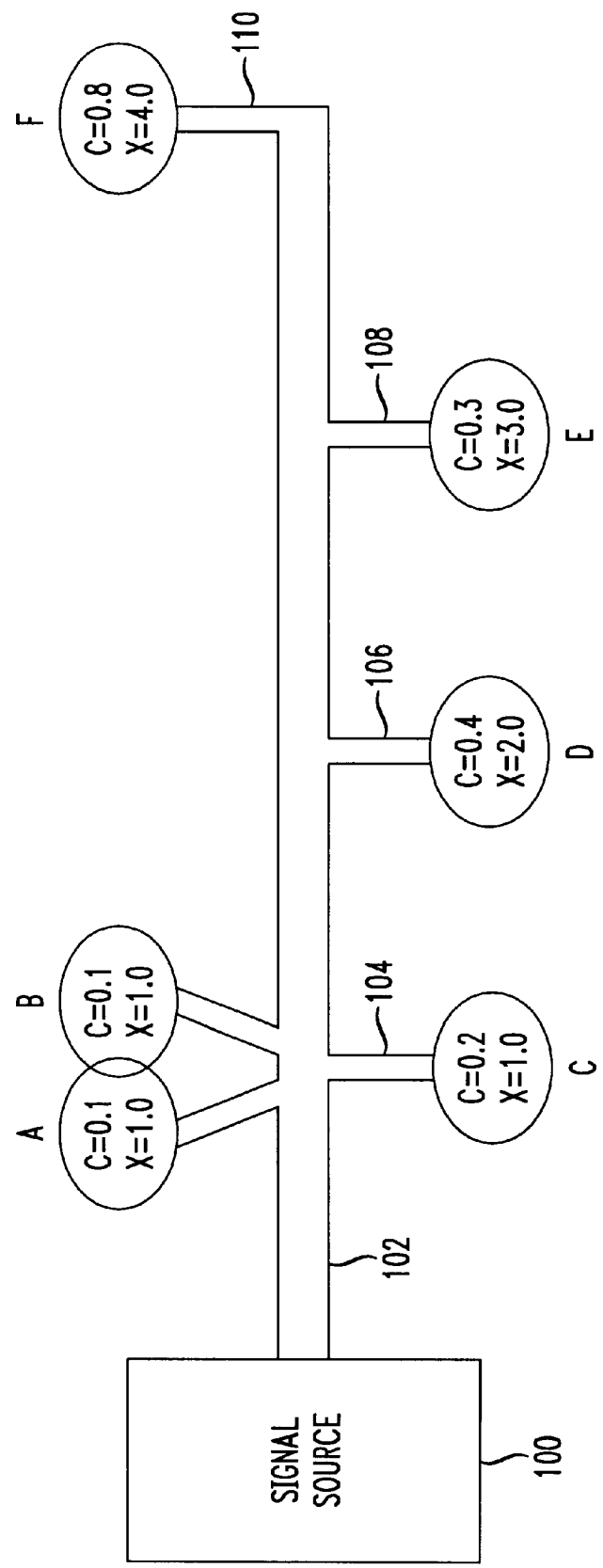
FIG. 2 shows grouping of separate elements receiving a common signal, in accordance with the principles of the present invention.

FIG. 2 shows grouping of separate elements A–F at one hierarchical level receiving a common signal from a signal source 100, in accordance with the principles of the present invention. In particular, the separate elements A–F are shown in a grouping partly defined by an initial placement and routing of the signal line 102.

Elements A–F represent separate elements or loading blocks to the signal distribution network. Within each element A–F the capacitance C is indicated as is the distance X from the signal source 100. The distance X relates to a physical wiring distance from a driving element in the signal source 100 to the input element in the relevant element A–F. While the capacitance C is represented in picoFarads (pF) and the distance is represented in millimeters (mm), capacitance and/or distance measured in any particular parameter is within the scope of the present invention.

Thus, in the example shown in FIG. 2, element groups A, B and C are all fed the common signal from a node 104 on the central wiring 102, which is at a distance of 1.0 mm from the output of the signal source 100. Similarly, element group D is fed by a node 106 at a distance of 2.0 mm from the signal source 100, element group E is fed by a node 108 at a distance of 3.0 mm from the signal source 100, and element group F is fed by a node 110 at a distance of 4.0 mm from the signal source 100.

To simplify the optimization of the skew, it is within the scope of the present invention to group elements A–F in accordance with a range of distance, but of course this will degrade the improvement to the resultant skew. Thus, for instance, those elements within a range of 0.5 to 1.5 mm from the signal source 100 may be grouped as being 1.0 mm from the signal source 100, those elements within a range of 1.6 mm to 2.5 mm may be grouped as being 2.0 mm from the signal source 100, and so on. The resolution of the grouping is dictated only by the application and the desired reduction in skew of the common signal as applied to each of the elements A–F.

Each load or element A–F may be a large block of components, e.g., a functional block, or may be a small poly cell, depending upon the needs of the application. In accordance with the grouping phase of the inventive method, the separate loads are grouped by an approximate distance (or range) from the signal source 100 while at the same time grouping elements based on a multiple of a unit loading. Accordingly, more than one group may exist at any one node. A best fit unit loading can be determined by shifting elements among groups at any one particular distance X. In many if not most cases, a perfect unit loading will not be obtained within each group. In this case, a compensation scheme is implemented to bring the relevant grouping up to an integral multiple of a best fit loading.

In the wiring network shown in FIG. 2, element groups A, B and C are assigned to a first group, element group D is assigned to a second group, element group E is assigned to a third group, and element group F is assigned to a fourth group. In the disclosed example, the unit loading is C=0.4 pF.

Note that although the distances X are integral multiples in the disclosed embodiment, this need not be so. For instance, the invention is equally applicable to elements which are grouped at 1.0, 1.5, 1.8, 2.0 and 4.0 mm from the signal source 100.

After the elements are grouped into a best fit with respect to a load capacitance of each group, each group is provided its own wiring from a common point, e.g., at the output of the signal source 100, and appropriate delay elements 102–106 are added to the element groups which are closest to the signal source 100 to equalize a total delay as seen by each of the element groups.

Figure 3:
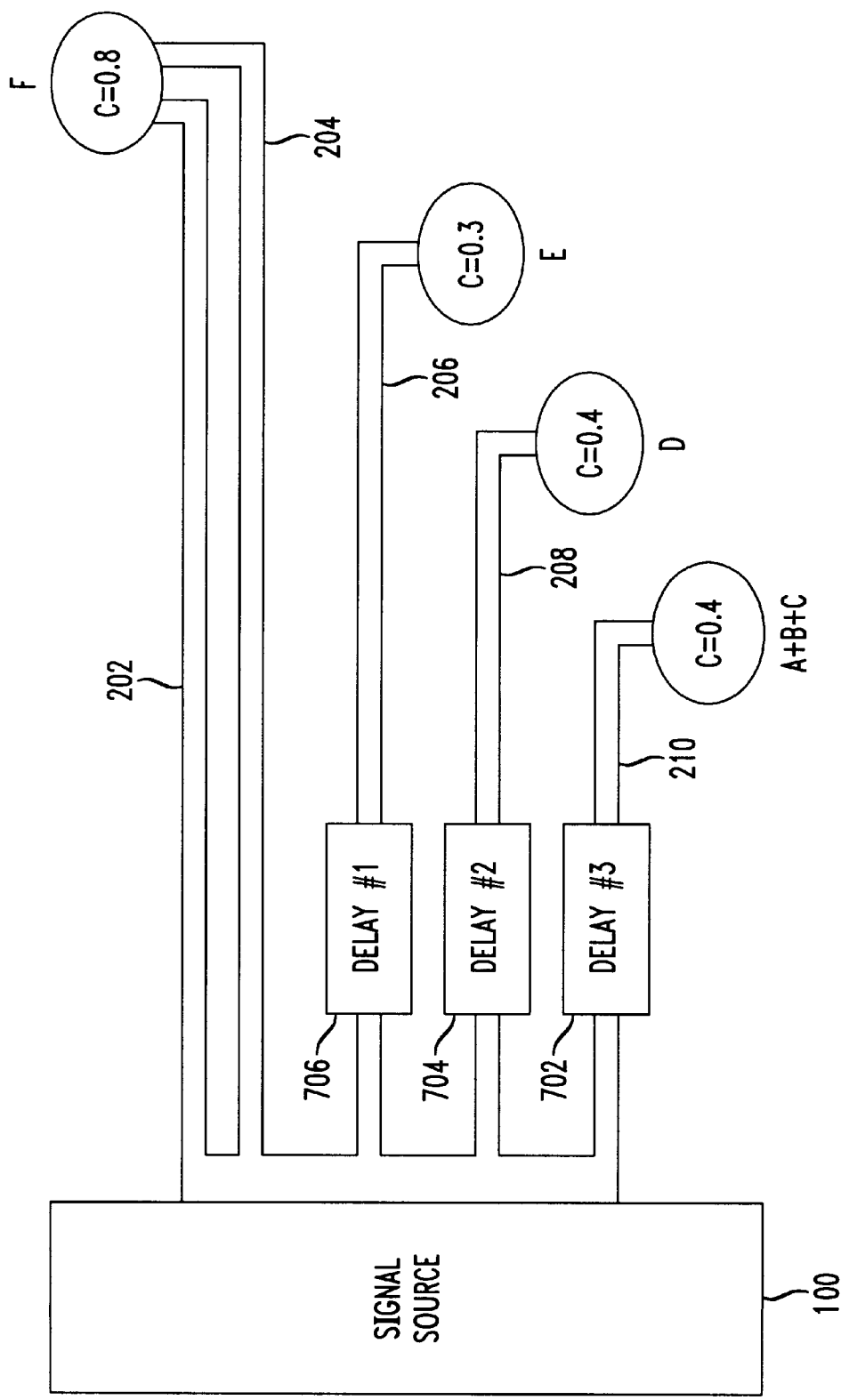
FIG. 3 shows insertion of delay elements in shorter traces from the common signal, in accordance with the principles of the present invention.

FIG. 3 shows this next step of wiring each group separately and inserting delay elements as necessary in the shorter wiring traces from the common signal, in accordance with the principles of the present invention.

In particular, each grouping is provided with one similarly characterized wiring path for each unit capacitance. Thus, the grouping of element groups A, B and C receive one wiring path 210 based on the C=0.4 pF capacitance total for that group. Similarly, the element group D is provided with one wiring path 208, and element E is provided with one wiring path 206. Because the last element group F loads the signal twice as much as the other groups, i.e., its capacitance is 0.8 pF as compared to a 0.4 pF unit loading of the other groups, it is provided with two wiring paths 202 and 204.

In each of the wiring paths (except for the longest wiring path(s) 202 and 204), one or more appropriate delay elements 702–706 are inserted to equate the total RC time constant of the affected wiring path with that of the longest wiring path, e.g., wiring path 202 or 204.

The delay elements may be any appropriate delay mechanism, e.g., a buffer string, or simply a length of wiring, sufficient to provide an appropriate delay to equate the RC time constant of the affected wiring path to the RC delay of the longest wiring path, e.g., to the paths 202 or 204.

As shown in FIG. 3, the delay elements 702–706 are each a metal wiring line having the same width and thickness as the signal distribution lines 202–210. Moreover, the length of the delay lines forming the delay elements 702–706 are so defined that, after insertion, all loading nodes 102–110 in the wiring network experience the same loading/distance ratio, or same RC value.

Note that network distribution line uses the same width metal lines and should not allow any via in between so that the RC along the line keeps uniform and the insertion of the delay line would nicely balance the delay to each loading block.

Figure 4:
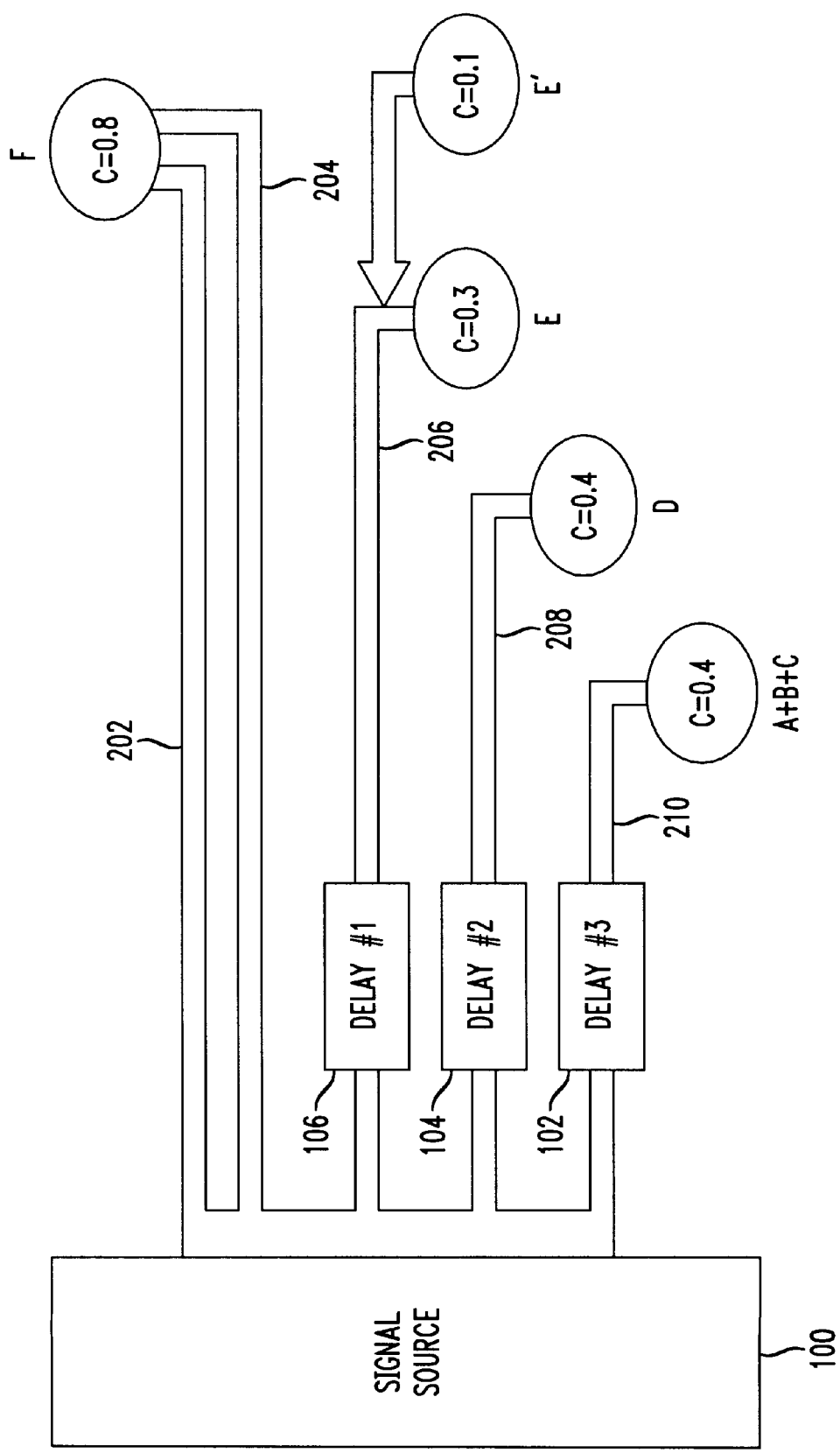
FIG. 4 shows the inclusion of compensation for disparities in loading of certain groups of elements, in accordance with the principles of the present invention.
Figure 5:
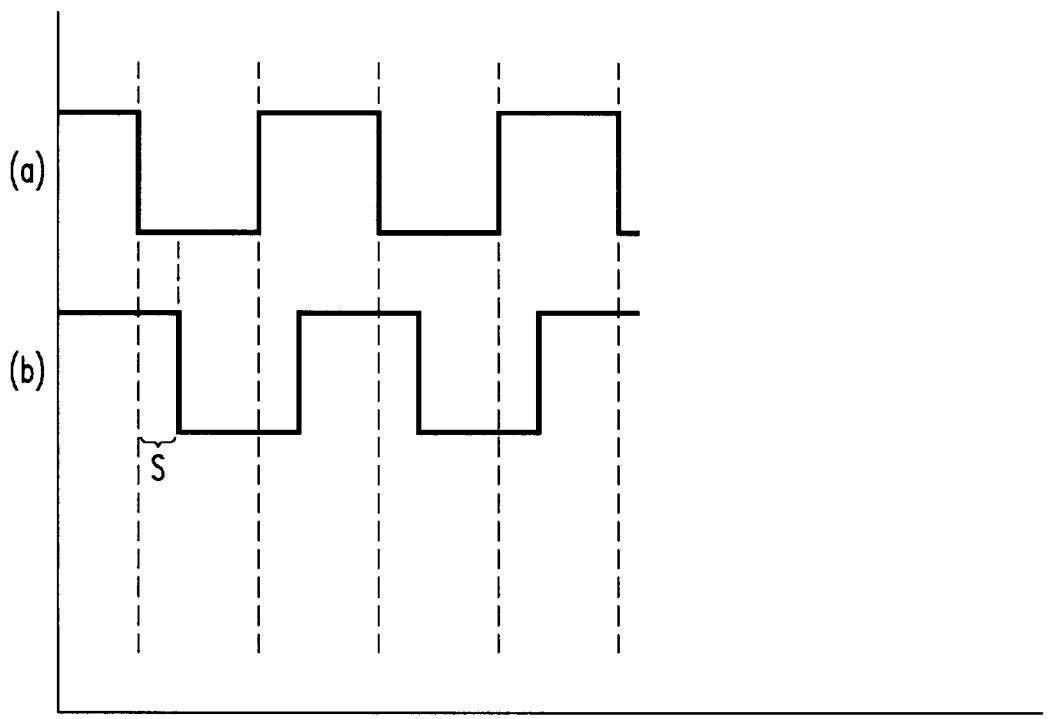
FIG. 5 depicts in idealistic form a common signal (e.g., a clock signal) which is skewed in waveform (b) with respect to that shown in waveform (a).

FIG. 4 shows the inclusion of a compensating element for those groups which do not provide a total loading equal to an integral of the unit loading.

In particular, a third general step in the method for reducing the skew of a clock signal is to compensate any node 102–110 in the wiring network as necessary to provide a unit loading. In the disclosed embodiment, the best fit (without exceeding) unit loading is C=0.4 pF, but the element group E includes a loading of only 0.3 pF. Thus, in this step, an additional element is included and wired to the relevant node 108 feeding the element group E to compensate for the deficit 0.1 pF of capacitance. This compensating element E is shown in FIG. 4.

In accordance with the principles of the present invention, all loading nodes of a relevant signal network provide the same (or substantially the same) RC time constant to the common signal routed therethrough. Thus, the common signal will reach each of the elements at substantially the same time, greatly reducing skew as between the signals presented to each of the separate elements. The present invention is particularly applicable and useful for high speed clock signals utilized by many elements in an integrated circuit or on a printed circuit board.

The principles of the present invention can be layered such that each hierarchical layer is optimized for minimal skew for a relevant signal in accordance with the principles of the present invention.

While the invention has been described with reference to the exemplary embodiments thereof, those skilled in the art will be able to make various modifications to the described embodiments of the invention without departing from the true spirit and scope of the invention.

What is claimed is:

1. A method of designing wiring routing to minimize skew of a common signal as applied to a printed circuit board having a plurality of elements with permanent positions previously established attached to a plurality of nodes, said method comprising:

grouping said plurality of elements with permanent positions previously established on said printed circuit board to respective nodes of said wiring routing based on a load associated with each of said plurality of elements, each node of said wiring routing having a distance from a signal source associated therewith and having substantially no greater than an approximate integer multiple of a unit loading grouped thereon;

routing a wire to each of said grouped plurality of elements; and compensating any necessary grouped plurality of elements with a load sufficient to bring a total load associated with said grouped plurality of elements to a load substantially equal to an integer multiple of said unit loading.

2. The method of designing wiring routing to minimize skew of a common signal as applied to a printed circuit board having a plurality of elements with permanent positions previously established attached to a plurality of nodes according to claim 1, wherein:

said unit loading is determined based on a load associated with each of said plurality of elements, and a desired number of groupings.

3. The method of designing wiring routing to minimize skew of a common signal as applied to a printed circuit board having a plurality of elements with permanent positions previously established attached to a plurality of nodes according to claim 1, wherein:

said unit loading and a number of said groupings are determined based on an optimum unit loading value determined from all possible groupings of said plurality of elements.

4. The method of designing wiring routing to minimize skew of a common signal as applied to a printed circuit board having a plurality of elements with permanent positions previously established attached to a plurality of nodes according to claim 1, wherein:

said common signal is a clock signal.

5. The method of designing wiring routing to minimize skew of a common signal as applied to a printed circuit board having a plurality of elements with permanent positions previously established attached to a plurality of nodes according to claim 1, further comprising:

inserting a delay element in a path of at least one of said routed wires.

6. The method of designing wiring routing to minimize skew of a common signal as applied to a printed circuit board having a plurality of elements with permanent positions previously established attached to a plurality of nodes according to claim 1, further comprising:

inserting a delay element in a path of all but a shortest one of said routed wires.

7. The method of designing wiring routing to minimize skew of a common signal as applied to a printed circuit board having a plurality of elements with permanent positions previously established attached to a plurality of nodes according to claim 6, wherein said delay element comprises:

at least one buffer.

8. The method of designing wiring routing to minimize skew of a common signal as applied to a printed circuit board having a plurality of elements with permanent positions previously established attached to a plurality of nodes according to claim 6, wherein said delay element comprises:

at least one inverter.

9. The method of designing wiring routing to minimize skew of a common signal as applied to a printed circuit board having a plurality of elements with permanent positions previously established attached to a plurality of nodes according to claim 6, wherein said delay element consists of:

a length of wiring.

10. The method of designing wiring routing to minimize skew of a common signal as applied to a printed circuit board having a plurality of elements with permanent positions previously established attached to a plurality of nodes according to claim 6, wherein:

said distance is an integer multiple of a unit distance.

11. Apparatus for designing wiring routing to minimize skew of a common signal as applied to a printed circuit board having a plurality of elements with permanent positions previously established attached to a plurality of nodes, comprising:

means for grouping said plurality of elements with permanent positions previously established on said printed circuit board to respective nodes of said wiring routing based on a load associated with each of said plurality of elements, each node of said wiring routing having a distance from a signal source associated therewith and having substantially no greater than an integer multiple of an approximate integer multiple of a unit loading grouped thereon;

means for routing a wire to each of said grouped plurality of elements; and means for compensating any necessary grouped plurality of elements with a load sufficient to bring a total load associated with said group plurality of elements to a load substantially equal to an integer multiple of said unit loading.

12. The apparatus for designing wiring routing to minimize skew of a common signal as applied to a printed circuit board having a plurality of elements with permanent positions previously established attached to a plurality of nodes according to claim 11, wherein:

said means for grouping determines said unit loading based on a load associated with each of said plurality of elements, and a desired number of groupings.

13. The apparatus for designing wiring routing to minimize skew of a common signal as applied to a printed circuit board having a plurality of elements with permanent positions previously established attached to a plurality of nodes according to claim 11, wherein:

said means for grouping determines said unit loading and a number of said groupings based on an optimum unit loading value determined from all possible groupings of said plurality of elements.

14. The apparatus for designing wiring routing to minimize skew of a common signal as applied to a printed circuit board having a plurality of elements with permanent positions previously established attached to a plurality of nodes according to claim 11, wherein:

said common signal is a clock signal.

15. The apparatus for designing wiring routing to minimize skew of a common signal as applied to a printed circuit board having a plurality of elements with permanent positions previously established attached to a plurality of nodes according to claim 11, further comprising:

means for inserting a delay element in a path of at least one of said routed wires.

16. The apparatus for designing wiring routing to minimize skew of a common signal as applied to a printed circuit board having a plurality of elements with permanent positions previously established attached to a plurality of nodes according to claim 11, further comprising:

means for inserting a delay element in a path of all but a shortest one of said routed wires.

17. The apparatus for designing wiring routing to minimize skew of a common signal as applied to a printed circuit board having a plurality of elements with permanent positions previously established attached to a plurality of nodes according to claim 16, wherein said delay element comprises:

at least one buffer.

18. The apparatus for designing wiring routing to minimize skew of a common signal as applied to a printed circuit board having a plurality of elements with permanent positions previously established attached to a plurality of nodes according to claim 16, wherein said delay element comprises:

at least one inverter.

19. The apparatus for designing wiring routing to minimize skew of a common signal as applied to a printed circuit board having a plurality of elements with permanent positions previously established attached to a plurality of nodes according to claim 16, wherein said delay element consists of:

a length of wiring.

20. The apparatus for designing wiring routing to minimize skew of a common signal as applied to a printed circuit board having a plurality of elements with permanent positions previously established attached to a plurality of nodes according to claim 16, wherein:

said distance determined by said means for grouping is an integer multiple of a unit distance.

21. A wired circuit having minimized skew of a common signal as applied to a printed circuit board having a plurality of elements with permanent positions previously established attached to a plurality of nodes, comprising:

a plurality of elements with permanent positions previously established on said printed circuit board receiving said common signal, said plurality of elements being located and wired to respective nodes of wiring routing based on a load associated with each of said plurality of elements, each node of said wiring routing having a distance from a signal source associated therewith and having substantially no greater than an approximate integer multiple of a unit loading grouped thereon; and at least one compensating element grouped together with at least one of said plurality of elements having a load sufficient to bring a total load associated with said grouped at least one compensated with at least one plurality of elements to a load substantially equal to an integer multiple of said unit loading.

* * * * *